United States Patent [19]

Kou

[11] Patent Number: 5,114,528

[45] Date of Patent: May 19, 1992

[54] EDGE-DEFINED CONTACT HEATER APPARATUS AND METHOD FOR FLOATING ZONE CRYSTAL GROWTH

[75] Inventor: Sindo Kou, Madison, Wis.

[73] Assignee: Wisconsin Alumni Research Foundation, Madison, Wis.

[21] Appl. No.: 563,706

[22] Filed: Aug. 7, 1990

[51] Int. Cl.$^5$ .................................. B01J 17/10
[52] U.S. Cl. ......................... 156/616.1; 156/620.7; 156/620.71; 156/620.73; 156/620.74; 156/DIG. 88; 422/250; 422/254; 373/139
[58] Field of Search .......... 156/620.7, 620.71, 620.73, 156/620.74, DIG. 88; 422/250, 254; 373/139

[56] References Cited

U.S. PATENT DOCUMENTS

| | | | |
|---|---|---|---|
| 2,992,311 | 7/1961 | Keller | 422/250 |
| 3,471,266 | 5/1967 | La Belle, Jr. | 156/608 |
| 3,527,574 | 9/1970 | La Belle, Jr. | 156/605 |
| 3,591,348 | 7/1971 | La Belle, Jr. | 156/608 |
| 3,701,636 | 10/1972 | La Belle, Jr. | |
| 3,846,082 | 11/1974 | La Belle, Jr. et al. | |
| 3,915,662 | 10/1975 | La Belle, Jr. et al. | 23/301 SD |
| 3,977,934 | 8/1976 | Lesk | 156/620.7 |
| 4,039,283 | 8/1977 | Keller | 156/620.7 |
| 4,109,128 | 8/1978 | Kohl | 422/250 |
| 4,167,554 | 9/1979 | Fisher | 422/246 |
| 4,225,378 | 9/1980 | Garrison | 156/608 |
| 4,258,009 | 3/1981 | De Leon et al. | 422/250 |
| 4,554,203 | 11/1985 | Grabmaier et al. | 428/229 |
| 4,556,448 | 12/1985 | Kim et al. | 156/605 |
| 4,634,491 | 1/1987 | Benn | 156/603 |
| 4,645,560 | 2/1987 | Matsumoto et al. | 156/607 |
| 4,654,110 | 3/1987 | Morrison | 156/607 |
| 4,664,742 | 5/1987 | Tomizawa et al. | 156/607 |
| 4,738,831 | 4/1988 | Naumann et al. | 422/246 |
| 4,740,264 | 4/1988 | Naumann et al. | 156/620.76 |
| 4,749,837 | 6/1988 | von Ammon et al. | 219/10.79 |
| 4,752,451 | 6/1988 | Aubert et al. | 422/250 |

OTHER PUBLICATIONS

D. B. Gasson, "The Preparation of Calcium Tungstate Crystals by a Modified Floating Zone Recrystallization Technique," J. Sci. Instrum., 1965, vol. 42, pp. 114–115.
J. J. Brissot et al., "Preparation of Artificial Calcite Single Crystals by Solvent Zone Melting," Journal of Crystal Growth, vol. 8, 1971, pp. 213–215.
C. Belin et al., "The Growth of Calcite Single Crystals by Traveling Solvent Zone Melting," Journal of Crystal Growth, vol. 13/14, 1972, pp. 497–600.
R. M. Henson et al., "Growth of Single Crystal $Ba_{0.65}Sr_{0.35}TiO_3$ by Solvent Zone Melting," Journal of Crystal Growth, vol. 26, 1974, pp. 174–176.
Philip R. Swinehart, "Proposed Floating-Zone, Emersed-Heater Method for the Growth of Trigonal Selenium Single Crystals," Journal of Growth, vol. 26, 1974, pp. 317–318.
Christian Belin, "On the Growth of Large Single Crystals of Calcite by Traveling Solvent Zone Melting," Journal of Crystal Growth, vol. 34, 1976, pp. 341–344.
C. E. Turner et al., "The Growth of Barium Titanate Single Crystals by the Traveling Solvent Zone Technique," Journal of Crystal Growth, vol. 56, 1982, pp. 137–140.
Communication from M. D. Lind of Rockwell International to Sindo Kou with copies of slides shown at a presentation by M. D. Lind, et al., entitled "Floating Zone Processing in Earth-Orbit," TMS, New Orleans, La., 1986.

*Primary Examiner*—Robert Kunemund
*Assistant Examiner*—Felisa Garrett
*Attorney, Agent, or Firm*—Foley & Lardner

[57] ABSTRACT

An apparatus for growing a moncrystalline body (30) from a polycrystalline feed rod (22) includes a heater (20) that is positioned to heat a short section of the polycrystalline rod (22) to create a molten zone (34). The heater (20) is formed to include a shaper (40) that contacts the polycrystalline rod (22) in the molten zone (34) and has a hole (46) to allow flow in the molten zone (34) between the polycrystalline rod (22) side and the monocrystalline body (30) side of the shaper. The shaper (40) has an edge (42) that defines the boundary of the cross-section of the monocrystalline body (30) that is formed as the molten material solidifies.

22 Claims, 6 Drawing Sheets

EDGE-DEFINED CONTACT HEATER APPARATUS AND METHOD FOR FLOATING ZONE CRYSTAL GROWTH

This invention was made with United States government support awarded by NASA, Grant #: NAG8-705. The United States government has certain rights in this invention.

FIELD OF THE INVENTION

This invention relates to apparatuses and methods employed in the growing of a monocrystalline structure from a melt of polycrystalline material.

BACKGROUND OF THE INVENTION

Monocrystalline material is used in the manufacture of a wide variety of products, such as electrical circuitry, optical systems, and other microminiature devices. There are a number of methods that are utilized in the growth of a monocrystalline structure from a melt. A synopsis of some of the more significant methods is given below.

The Czochralski method involves the melting of a polycrystalline charge in a crucible by radio frequency induction or resistance heating. A monocrystalline seed is then lowered into the melt while being rotated in a clockwise direction. The crucible and its charge are rotated in a counterclockwise direction. The seed crystal is withdrawn at a slow rate from the melt until the desired diameter of the pulled monocrystalline structure is obtained. The pull speed is increased to maintain the desired diameter of the pull. This procedure continues as long as there is melt remaining in the crucible. One problem encountered with the Czochralski method is that of controlling the cross-sectional area of the crystal. While a circular cross-section is produced, the diameter of the crystal has a tendency to vary widely as the growth proceeds. An additional disadvantage is that the monocrystalline structure pulled from the charge may be contaminated by the material of the crucible.

The Stepanov method (See A. V. Stepanov, *Bull. Acad. Sci. USSR*, vol. 33 (1969), p. 1775) is a modification of the conventional Czochralski method. By the Stepanov method, a die member is mounted at a fixed position within the crucible such that the upper edges of the die are above the surface of the melt and the bottom of the die is well below the surface of the melt. The key to Stephanov's technique is shaping a melt column, and the melt column shape is used to control the crystal shape. See H. E. LaBelle, Jr., *J. Crystal Growth*, Vol. 50, 1980, p. 8. A difficulty with the Stepanov method is that constant control of the melt level in the crucible is required, as the level of the melt and hence the shape of the melt column will vary upon formation of the crystal.

In the edge-defined, film-fed growth (EFG) technique, the shape of the crystalline body is determined by the external or edge configuration of the end surface of a forming member or die. An advantage of the process is that bodies of selected shapes such as round tubes or flat ribbons can be produced. The process involves growth on a seed from a liquid film of feed material sandwiched between the growing body and the end surface of the die, with the liquid in the film being continuously replenished from a suitable melt reservoir via one or more capillaries in the die member. By appropriately controlling the pulling speed of the growing body and the temperature of the liquid film, the film can be made to spread (under the influence of the surface tension at its periphery) across the full expanse of the end surface of the die until it reaches the perimeter or perimeters thereof formed by intersection of that surface with the side surface or surfaces of the die. The angle of intersection of the aforesaid surfaces of the die is such relative to the contact angle of the liquid film that the liquid's surface tension will prevent it from overrunning the edge or edges of the die's end surface. The growing body grows to the shape of the film which conforms to the edge configuration of the die's end surface.

The Bridgman-Stockbarger method utilizes an elongated container of material which is melted in a high temperature furnace, after which the container is lowered into a cooler, lower temperature furnace, which allows the material to slowly resolidify as a single crystal. The molten material from which the crystal is grown is completely enclosed during the process, and as a result, strains occur in the material which induce defects when the molten material solidifies.

Float zone refining is another method used to convert polycrystalline material to a high quality monocrystalline rod and, simultaneously, to remove unwanted impurities from the material. In the float zone technique a narrow molten zone is caused to move slowly along the length of a vertically disposed rod of polycrystalline material. As the molten zone moves, the material immediately behind the zone resolidifies as monocrystalline material. The monocrystalline growth is initially nucleated by a single crystal seed and then continues in a self-seeding manner. Impurities in the material tend to congregate in front of the molten zone so that as the as the molten zone moves, the zone also removes impurities with it, leaving the material behind the zone in a purer state.

In the float zone process with a contactless heater, the molten zone is caused to traverse the length of the polycrystalline rod by moving the rod vertically downward past a stationary heating means such as a radio frequency induction coil that surrounds a material in the contactless manner. In an alternate embodiment of the float zone refining process with a contactless heater, the rod is stationary and the heater moves vertically across the length of the rod. In addition to the translational motion, a rotational motion may also be imparted to improve crystal perfection and uniformity. The float zone process with a contactless heater, while producing a clean monocrystalline result, is very unstable in that the melt zone tends to collapse. Other difficulties in the float zone process with a contactless heater include the presence of a strong thermocapillary flow in the melt that results in banding and the fact that the melt/crystal interface is convex (rather than flat) toward the melt, resulting in solute segregation and dislocations.

Float zone refining has evolved to incorporate a horizontal resistance sheet heater immersed in the melt zone instead of surrounding the material in a contactless manner, the melt flowing through a hole or holes in the heater. The float zone immersed heater process allows more precise control over the growth front, i.e., the melt/crystal interfaces. A flat growth front can be readily maintained in the immersed heater process, mainly because the heater is immediately adjacent to the growth front. Besides control over the growth front, the immersed-heater process has several additional advantages over other crystal growth processes. First, unlike the Bridgman-Stockbarger process, crystal "straining" or "sticking" caused by growing the crystal inside a crucible, cannot occur. Second, unlike in the floating-zone process without an immersed heater, the melt zone is very stable in the immersed-heater process. This is mainly because the melt zone is much shorter in the latter (usually around 1-2 mm) and, therefore, has a much smaller tendency to collapse. Third, growth initiation with a seed crystal is particularly easy with the immersed-heater process. The heater is initially in direct contact with the seed crystal. Consequently, the extent of melting in the seed crystal can be accurately controlled to insure a proper growth initiation.

The immersed-heater process was first used by Gasson (See D. B. Gasson, *J. Sci. Instrum.*, vol. 42 (1965), pp. 114-15) in 1965, for the growth of neodymium-doped single crystals of calcium tungstate ($CaWO_4$, melting point 1620° C.) for laser rods. In the preparation of such crystals by the Czochralski process, Gasson observed that the shape of the growth front was not only rather convex (toward the melt) but also quite difficult to control. The resultant crystals exhibited nonuniform optical transmission and this optical nonuniformity varied from crystal to crystal. In order to gain a precise control over the shape of the growth front and hence improve the quality and consistency of the crystals, an iridium immersed heater was employed. The heater was 1 mm thick, 10 mm wide, and 50 mm long, with two 1 mm-diameter holes near its center. The crystals, which were rotated at 60 rpm during growth, were 6 mm in diameter. They were reported to show better optical quality and consistency than the Czochralski pulled crystals.

The immersed-heater process was subsequently applied to the growth of the following crystals: 10 mm diameter $CaCO_3$ (See J. J. Brissot and C. Belin, *J. Cryst. Growth*, Vol. 8 (1971), pp. 213-15), 25 mm diameter $CaCO_3$ (See C. Belin, *J. Cryst. Growth*, Vol. 34 (1976), pp. 341-44), 8 mm diameter $BaTiO_3$ (See C. E. Turner, N. H. Mason and A. W. Morris, *J. Cryst. Growth*, vol. 56 (1982), pp. 137-40), and 8 mm diameter $Ba_{0.65}Sr_{0.35}TiO_3$ (See R. M. Hensen and A. J. Pointon, *J. Cryst. Growth*, vol. 26 (1974), pp. 174-76). A platinum sheet heater was used in all these cases. The use of the immersed-heater process to grow single crystals of hexagonal selenium has also been considered. See P. R. Swinehart, *J. Cryst. Growth*, vol. 26 (1974), pp. 317-18. More recently, 20 mm diameter crystals of $LiNbO_3$ have been grown using a platinum sheet heater (U.S. Pat. No. 4,752,451 issued to Aubert et al.) In the latter case, the heater was held stationary, and the feed rod and the growing crystal were moved and rotated. The moving and rotational speeds of the feed rod were different from those of the crystal. The diameter of crystals grown by the immersed-heater process often varies significantly along the crystal and the crystal surface is often rough. The main disadvantage of the immersed-heater process is that applications are limited by the requirement of chemical capability between the melt and the immersed heater.

SUMMARY OF THE INVENTION

In accordance with the present invention, an apparatus for float zone crystal growth includes a heater that is moved with respect to the length of a polycrystalline feed rod to form a monocrystalline body. The heater is positioned to heat a short section of the length of the polycrystalline rod to create a molten zone. The heater includes a shaper that contacts the polycrystalline rod in the molten zone and has a hole that allows flow of molten material in the molten zone between the polycrystalline rod side and the monocrystalline body side of the heater. The shaper has an edge that defines the boundary of the cross-section of the monocrystalline body that is formed as the molten material solidifies. The molten material is in contact with the shaper up to but not beyond the edge. The shaper is heated to maintain the material in a molten state just adjacent the edge but with the material crystallizing a short distance from the edge so that the crystallized rod assumes the outer boundary defined by the edge. If the shaper is wettable by the molten material, the surfaces of the shaper are formed so that surfaces inside the edge will hold the melt while surfaces outside the edge are at such an angle that gravity will not allow the melt to hold to the surfaces, and with proper adjustment of the surface angles being made depending on the degree of wettability.

The shaper may be formed in several ways. In a first, the edge of the shaper is a step in a heater shaped in the form of a sheet, the shaper being immersible within the cross-section of the molten zone and the step forming an outer periphery of the edge that defines the boundary of the cross-section of the monocrystalline body. In another form, the shaper step forms an inner periphery of the edge that defines the boundary of the cross-section of the monocrystalline body. In a further form, the edge of the shaper is shaped to contact the boundary of the cross-section of the monocrystalline body without immersion within the cross-section of the molten zone, and an inner periphery of the shaper defines the boundary of the cross-section of the monocrystalline body. The shaper may be an integral part of the heater, or it may be an independent part insertable within the surrounding structure of the heater. The shaper is independent of the heater in those instances where the material of the heater is incompatible with the melt and the shaper is of a material selected so as not to contaminate the melt. The present invention produces a monocrystalline body having a relatively uniform cross-section and a clean outer surface.

Further objects, features, and advantages of the invention will be apparent from the following detailed description taken in conjunction with the accompanying drawings.

DETAIL DESCRIPTION OF THE INVENTION

Figure 1:
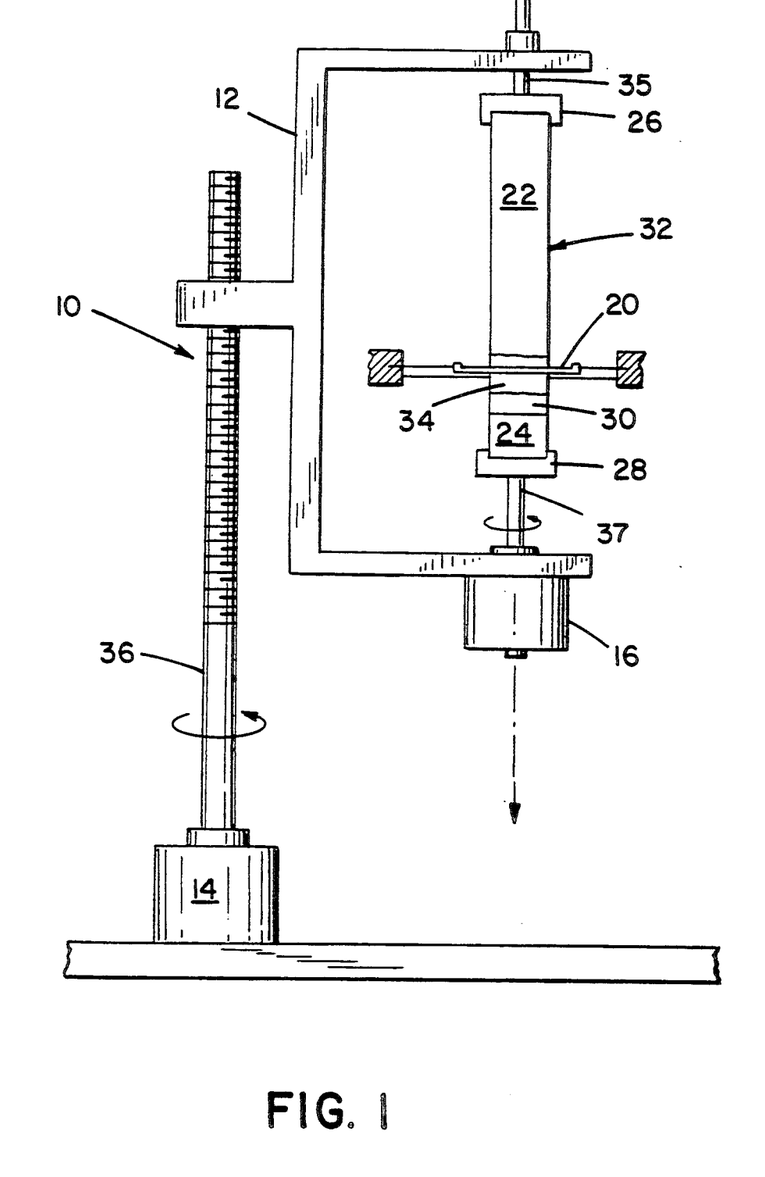
FIG. 1 is a schematic side view of an apparatus for float zone crystal growth in accordance with the present invention.

With reference to the drawings, a schematic side view of an apparatus for float zone crystal growth is shown generally at 10 in FIG. 1. The apparatus 10 comprises a bracket 12, a drive motor 14 for driving translational motion, a rotational motor 16, and a stationary heater 20. A polycrystalline feed rod 22 and a seed crystal mass 24 are mounted to the bracket 12 in a vertical orientation and the polycrystalline rod 22 and the seed crystal 24 meet at the heater 20. The polycrystalline rod 22 and the seed crystal 24 are held in place within the bracket 12 by end plates 26 and 28, respectively. The apparatus 10 grows a monocrystalline body 30 from the polycrystalline feed rod 22 by traversal of a molten zone 34 across the polycrystalline rod 22. The polycrystalline feed rod 22 and the monocrystalline body 30 are herein collectively referred to as the rod 32. FIG. 1 depicts a molten zone 34 that has traversed part way across the length of the rod 32 such that a portion of the rod 32 has been converted to the monocrystalline body 30 and a portion remains as a polycrystalline feed rod 22.

The molten zone 34 is formed by the stationary heater 20, described in greater detail below, that melts the proximate material of the rod 32. The rod 32 is moved relative to the heater 20 and the correspondent molten zone 34 is caused to traverse across the length of the rod 32 by the action of the translational motor 14. An output shaft 36 connected to the motor 14 is threaded and mates with a threaded opening in the bracket 12 such that upon rotation of the output shaft 36, the bracket 12 is capable of translation vertically upward and downward. Translation of the bracket 12 upward and downward changes the relative position of the heater 34 with respect to the rod 32. The rod 32 may be rotated, if desired, by the rotational motor 16. The rod 32 is mounted for rotation between spindles 35 and 37, which are attached to the end plates 26 and 28, respectively. Rotation is transmitted to the seed crystal 24 and monocrystalline body 30 from the rotational motor 16 by the spindle 37. It is to be understood that the arrangement of FIG. 1 is meant to be exemplary in that relative translation of the heater 20 with respect to the rod 32 and rotation of the monocrystalline portion of the rod may be accomplished by a number of different arrangements.

Figures 2, 3, 4:
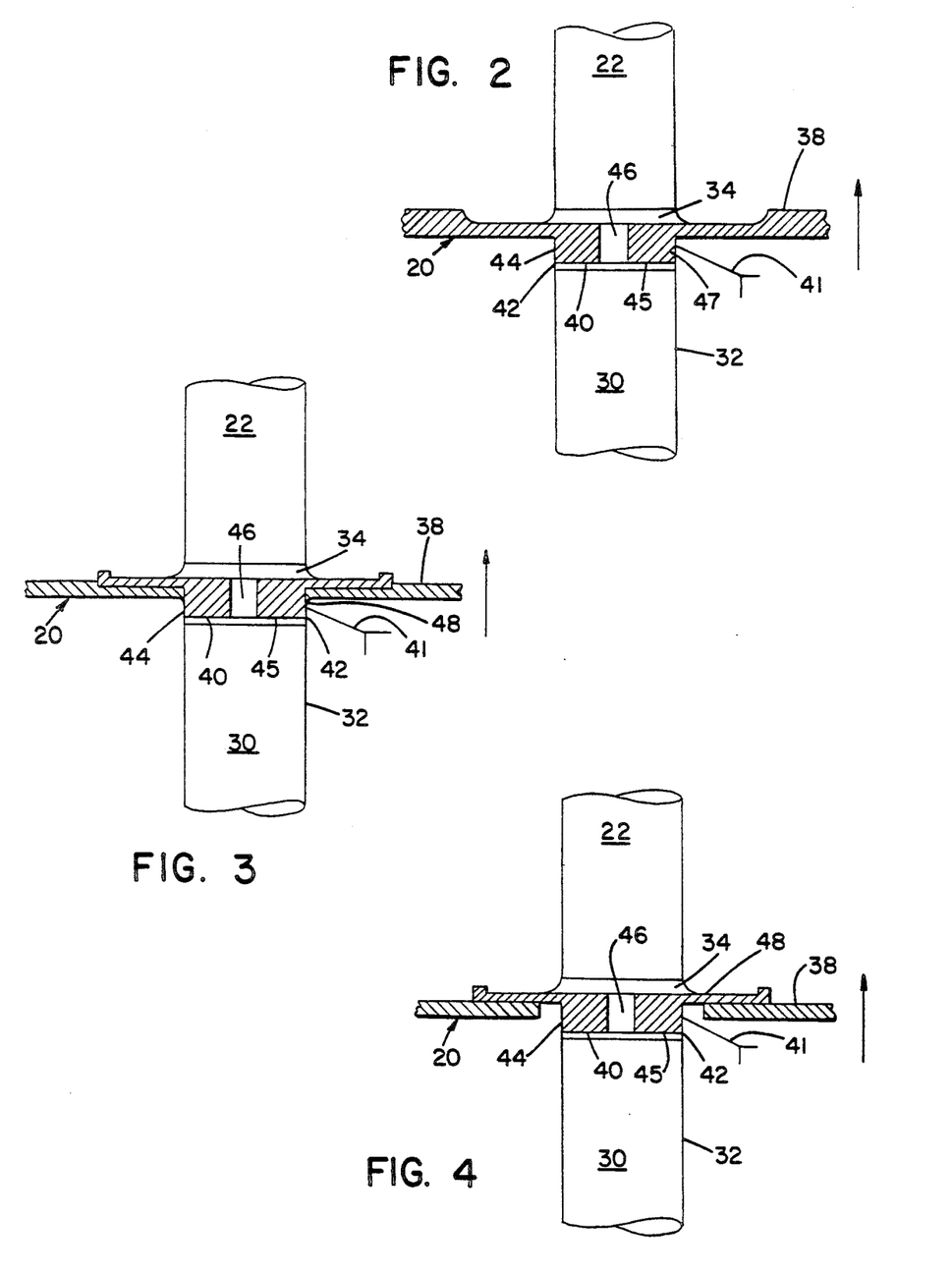
FIG. 2 is a vertical section view through the rod and the heater of the present invention.
FIG. 3 is a vertical section view through the rod and an alternate heater embodiment of the present invention.
FIG. 4 is a vertical section view through the rod and a second alternate heater embodiment of the present invention.

FIG. 2 shows a more detailed cross-sectional view of the heater 20 within the rod 32. The heater 20 is formed in a horizontal sheet 38, which is heated by resistance heating as an electrical current is passed through the heater, to create the molten zone 34. Electrical power is supplied to the heater in a conventional manner well known in the art. The temperature of the molten zone 34 is monitored by a thermocouple 41 that is connected to a portion of the heater 20 at the molten zone 34. The temperature of the heater at the molten zone is preferably maintained at a temperature approximately 5° C. above the melting point of the material of the rod 32 to prevent nucleation of crystals. A shaper 40 is incorporated within the heater 20 and has an edge 42 that defines the shape or boundary of the cross-section of the monocrystalline body 30 that is formed as the molten material solidifies. In FIG. 2, the edge 42 of the shaper 40 is defined by the intersection of a cylindrical sidewall 44 of a step 47, formed integrally within the sheet 38 and extending downwardly from the rest of the sheet, and a flat bottom surface 45 of the shaper. The outer peripheral edge 42 of the step 47 determines the boundary of the cross-section of the monocrystalline body 30. As should be apparent from the foregoing, the step 47 may be shaped to give a monocrystalline body 30 with a cross-section which is other than cylindrical. The portion of the heater 20 that is immersed within the molten zone 34 has an aperture or hole 46 to allow flow of molten material between the polycrystalline rod side and the monocrystalline body side of the heater.

FIGS. 3 and 4 show alternate arrangements in which the shaper 40 of the heater 20 is a separate piece that is inserted within a hole 48 in the sheet heater 38. The alternate arrangements of FIGS. 3 and 4 are used where the material of the sheet 38 is incompatible with the melt of the molten zone 34, e.g., where the sheet 38 would contaminate the monocrystalline body 30. The material of the shaper 40 of the heater 20 is selected so that it will not contaminate the monocrystalline body 30. For shapers having the form shown in FIGS. 2, 3, and 4, the material of the shaper 40 should also be such that the molten zone 34 wets the shaper. The preferred material for the shaper 40 may therefore vary depending on the material of the rod 32.

Figure 5:
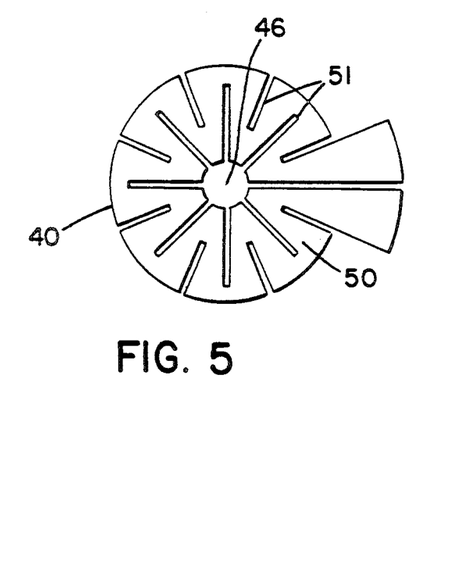
FIG. 5 is a top view of a shaper in accordance with the present invention.
Figure 6:
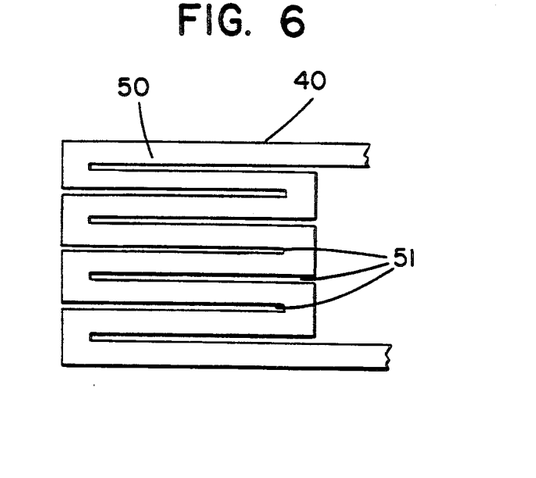
FIG. 6 is a top view of an alternate shaper in accordance with the present invention.

FIGS. 5 and 6 show top views of a shaper 40, the view of FIG. 5 representing the shaper 40 for a rod 32 of circular cross-section and the view of FIG. 6 representing the shaper 40 for a rod 32 of rectangular cross-section. The shaper 40 of the heater 20 is structured to have a resistance path 50 of maximal length for purposes of heating the shaper in a relatively uniform manner. To create a maximal resistance path 50, slots 51 are formed in the shaper such that the path 50 is arranged in a back-and-forth pattern around the circumference of the shaper. The slots also function as a hole or holes to allow flow of molten material from one side of the shaper to the other. Multiple holes of small diameter (not shown) may also be formed in the shaper to allow flow from one side to the other of the shaper and help produce a uniform distribution of any dopant in the melt.

Figure 7:
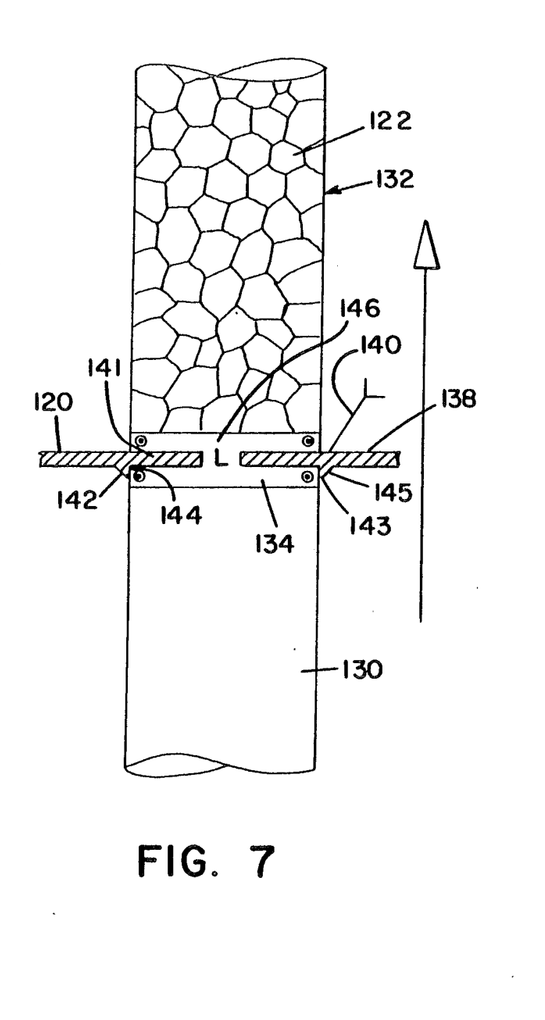
FIG. 7 is a vertical section view through the rod and a third alternate heater embodiment of the present invention.

FIG. 7 shows a cross section of an additional heater embodiment in accordance with the present invention, the view being taken in cross-section through a rod 132 which includes a polycrystalline feed rod 122 and a monocrystalline body 130, in the same manner in which the rod 32 is formed of the polycrystalline feed rod 22 and the monocrystalline body 30. A heater 120, formed in a horizontal sheet 138, is heated by electrical resistance to create a molten zone 134 adjacent the heater. The temperature of the molten zone 134 is monitored by a thermocouple 140 that is connected to a portion of the heater 120 at the molten zone 134. A shaper 141 is incorporated within the heater 120, and has an edge 142 that defines the shape or boundary of the cross-section of the monocrystalline body 130 that is formed as the molten material solidifies. As shown in FIG. 7, the edge 142 of the shaper 141 is defined by a narrow cylindrical step 143 that is formed integrally with and extends downwardly from the sheet 138, the step 143 having a cylindrical inner peripheral wall 144 that meets an inclined outer surface 145 to define an edge 142 that forms the boundary of the cross-section of the monocrystalline body 130. The step 143 may be shaped to give a monocrystalline body 130 with a cross-section that is cylindrical; however, it should be apparent that other cross-sectional shapes are also possible. The portion of the heater 120 that is immersed within the rod 132 has an aperture or hole 146 to allow flow of molten material in the molten zone 134 between the polycrystalline feed rod side and the monocrystalline body side of the molten zone. Although FIG. 7 shows the shaper 141 to be integral with the heater 120, the shaper may also be formed of a separate piece that is insertable within a hole in the sheet 138. It is particularly advantageous for the shaper 141 to be a separate piece from the sheet 138 when the material of the sheet 138 is incompatible with the melt of the molten zone 134. For the case of FIG. 7, the selected material of the shaper 141 should also be such that the molten zone 134 does not wet the shaper 141 so that there is little or no tendency for the molten material to migrate onto the outer surface 145. Because the inner wall 144 of the shaper is vertical, the melt will expand out to contact and be constrained by the wall, while the edge 142 will constrain the outer periphery of the melt since the molten material solidifies only a short distance from the edge 142, and the peripheral shape of the molten material between the edge and the interface with the solid crystal is maintained by surface tension. The selected material of the shaper 141 may therefore vary depending on the material of the rod 132.

Figure 8:
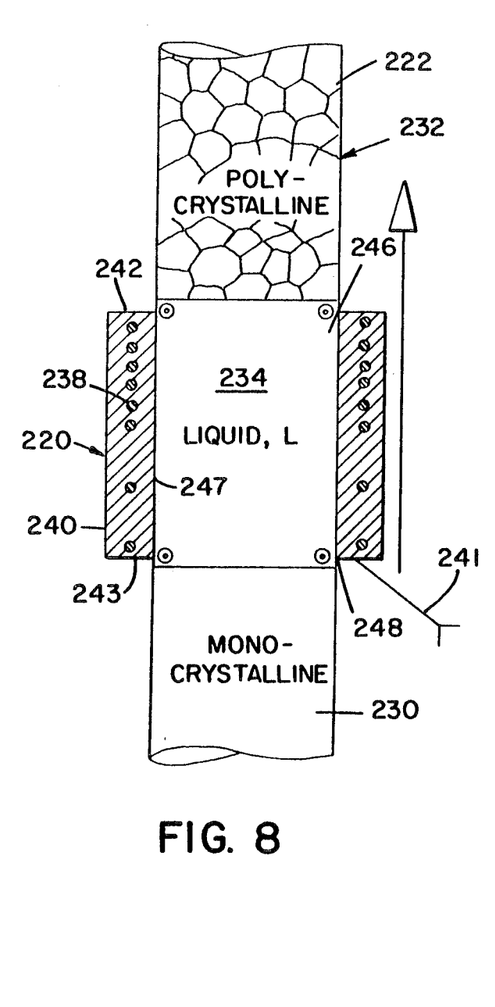
FIG. 8 is a vertical section view through the rod and a fourth alternate heater embodiment of the present invention.

FIG. 8 shows a detail of another embodiment in accordance with the present invention, the view being taken in cross-section through a rod 232 which includes a polycrystalline feed rod 222 and a monocrystalline body 230. A heater 220 is formed of a shaper 240 and a radio frequency (RF) induction coil 238, wound within the shaper 240 which generates heat when supplied with RF electrical power to create a molten zone 234. The temperature of the molten zone 234 is monitored by a thermocouple 241 that is connected to the heater 220 at the bottom portion of the shaper. The shaper 240 has a first or top end wall 242, a second or bottom end wall 243, and an aperture or hole 246 that allows flow of molten material in the molten zone 234 between the first and second ends through the hole 246. The hole 246 is bounded by an inner peripheral wall 247 that intersects the bottom end 243 at an edge 248 that defines the shape or boundary of the cross-section of the monocrystalline body 230 that is formed as the molten material solidifies. The hole 246 and the edge wall 247 are visible in FIG. 9, which is a top view of the heater 220. The shaper 240 is formed so that its edge wall 247 is preferably slightly larger in cross-section than the cross-section of the polycrystalline rod 222 and the monocrystalline body 230 so that only the edge wall 247 is in contact with molten material within the molten zone 234. In the shaper 240 of FIGS. 8 and 9, the edge 248 is circular, to yield a monocrystalline body 230 with a cross-section that is circular. However, it should be apparent that other cross-sectional shapes are also possible. The shaper 240 must be selected of a material that is compatible with the melt of the molten zone 234. For the shaper structure of FIGS. 8 and 9, the material of the shaper 240 should also be selected such that the molten zone 234 does not wet the shaper so that molten material does not cling to the bottom end wall 243. The selected material of the shaper 240 may therefore vary depending on the material of the rod 232.

Figure 9:
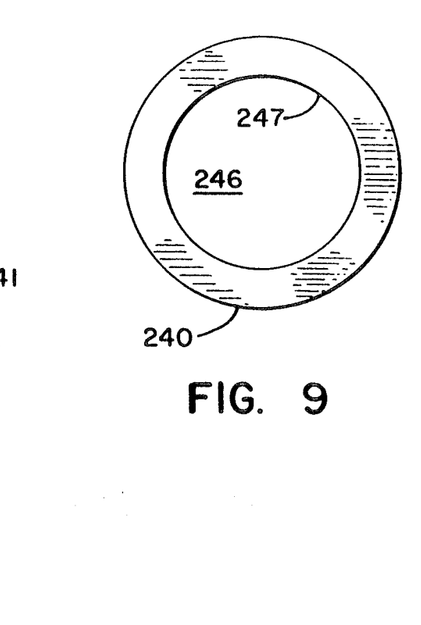
FIG. 9 is a top view of the fourth alternate heater embodiment of the present invention.
Figure 10:
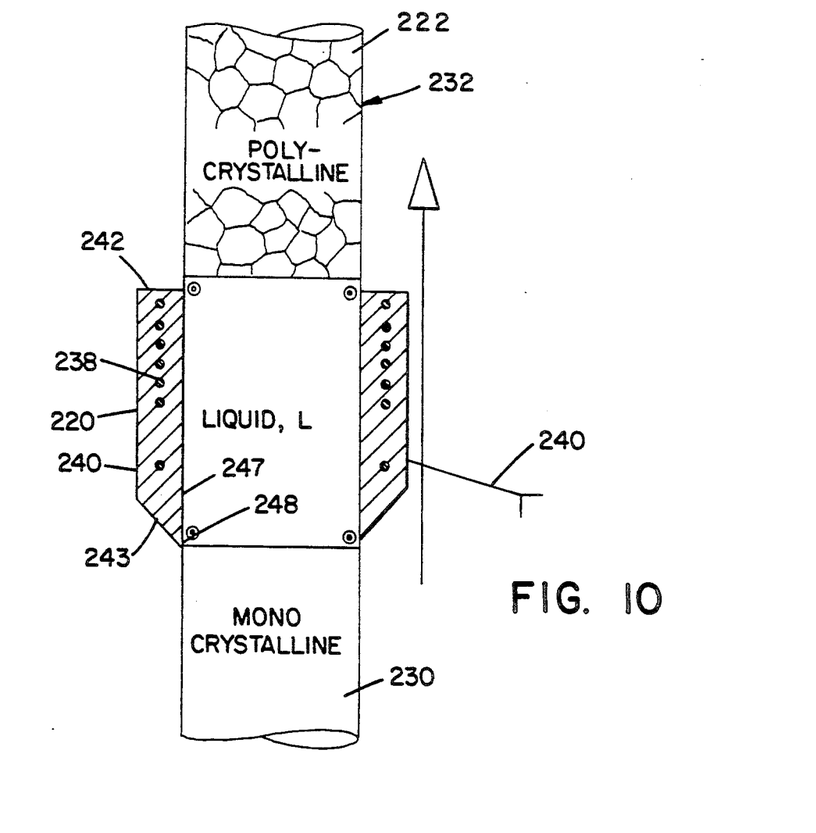
FIG. 10 is a vertical section through the rod and a fifth alternate heater embodiment of the present invention.

FIG. 10 depicts a modification of the embodiment of FIGS. 8 and 9 in which the second or bottom end wall 243 of the shaper 240 is beveled. Such a beveling of the second end 243 also assists in minimizing wetting of the end wall 243 by the molten zone 234 to obtain the melt within the shaper edge 248. A preferred bevel angle for the second end wall 243 is 45° with respect to the vertical interior wall 247.

Figure 11:
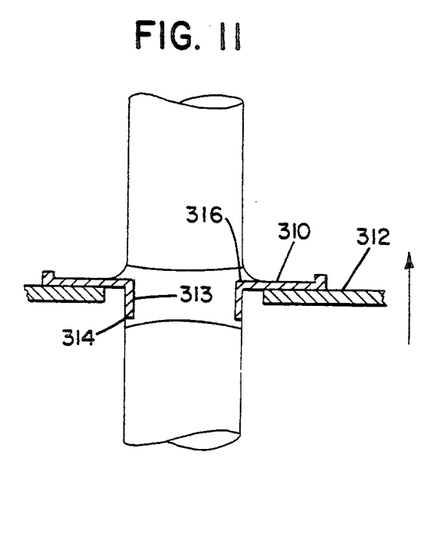
FIG. 11–18 are cross-sectional views through modified shaper configurations of the invention.
Figure 12:
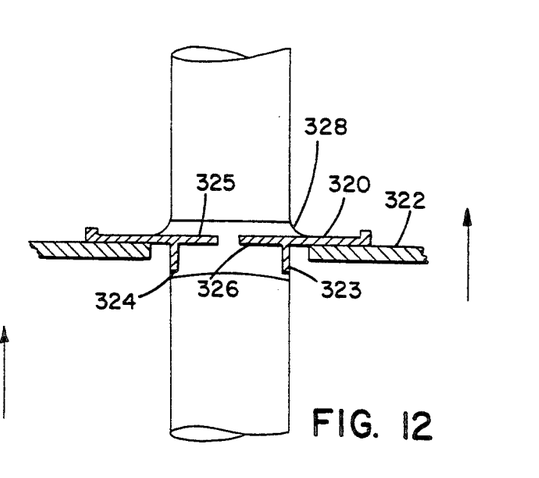

FIG. 11 shows a shaper 310 mounted in a heater 312 in which the internal surface of the shaper wall 313 is in contact with the melt. The wall terminates in a bottom edge 314 at the outside surface of the shaper. The shaper 310 is wetted by the melt 316. This configuration is found to be advantageous for shaping materials subject to porosity although the control of a flat growth front is not as precise as with the arrangement of FIG. 4. The shaper 320 of FIG. 12 is similar to the shaper 310, having a heater 322, shaper wall 323, and bottom edge 324. The shaper 320 has a top wall 325 that has an opening 326 therein to allow flow of molten material and thus has some of the functional characteristics of the shaper of FIG. 4. This shaper is also wetted by the melt 328. This shaper configuration is more resistant to porosity formation than the shaper of FIG. 4, more easily melts through a larger rod than the shaper of FIG. 11, but has less precise control over the growth front shape than the shaper of FIG. 4.

Figure 13:
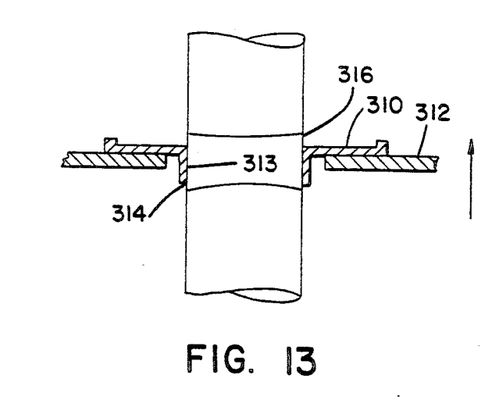
Figure 14:
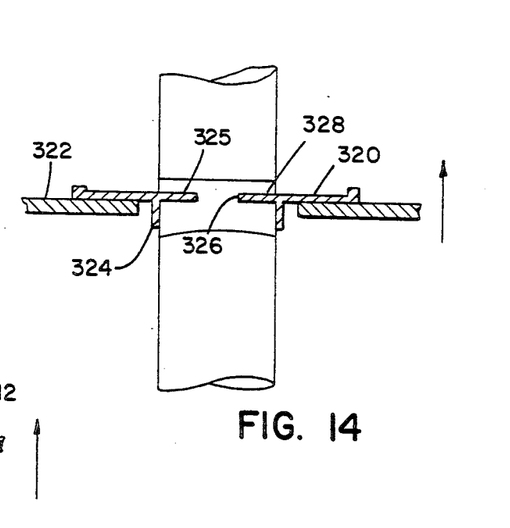
Figure 15:
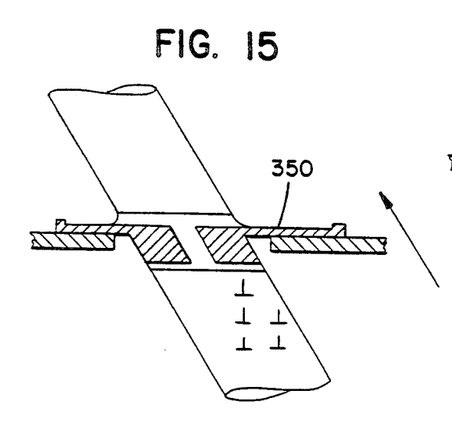
Figure 16:
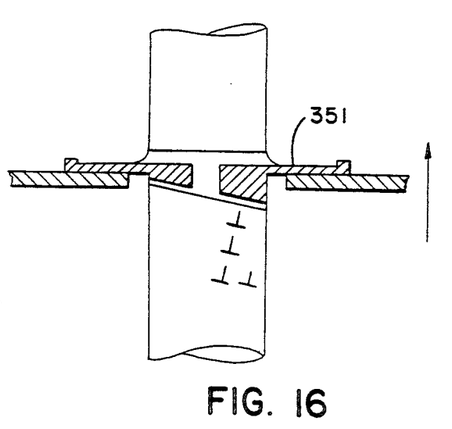
Figure 17:
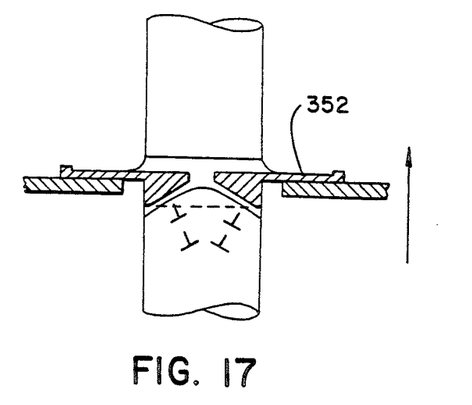
Figure 18:
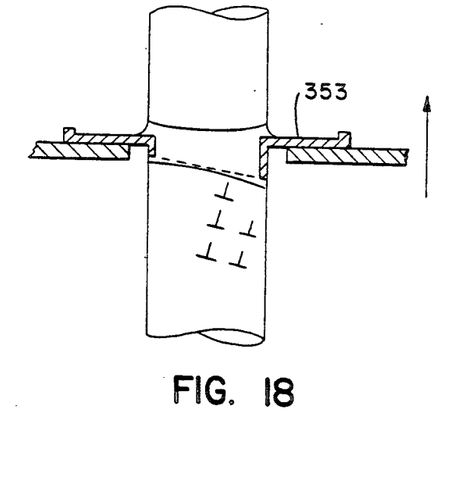

FIGS. 13 and 14 illustrate the formation of the melt for the shapers of FIGS. 11 and 12, respectively, when these shapers are not wetted by the melt. The bottom surfaces of the shapers can be beveled if desired.

It has been reported that dislocations (a major defect degrading the quality of a crystal) which form during solidification, i.e., the so-called grown-in dislocations, tend to grow perpendicular to the growth front. See, e.g., B. Chalmers, *Principles of Solidification*, John Wiley, New York, 1964, p. 306,307; H. Klapper, "Defects in Non-Metal Crystals," in *Characterization of Crystal Growth Defects by X-ray Methods*, edited by B. K. Tanner and D. K. Bowen, Plenum Press, New York, 1980, p. 133; B. Cockayne and J. M. Roslington, Journal of Materials Science, Vol. 8, 1975, p. 601. In the present invention, the shape of the growth front can be effectively controlled. As such, one is able to design the shapers such that grown-in dislocations ($\perp$) can grow out of the crystal. Designs for such shapers 350 through 353 are illustrated in FIGS. 15 through 18, respectively. In this way, the resultant single crystal is free from grown-in dislocations, except in the initial portion. K. Wada, et al., Journal of Crystal Growth, Vol. 50, 1981, p. 151, report a design for a die in edge-defined film-fed growth of $Al_2O_3$ ribbons which produces a convex growth front and reduces grown-in dislocations significantly.

In an exemplary operation of the present invention utilizing the heater structures described above, a polycrystalline feed rod 22 is vertically positioned between the end plates 26 and 28 shown in FIG. 1 so as to abut against the top of the heater to melt the material of the rod 22, which then flows through the heater into contact with the seed crystal 24. Beginning at the seed crystal 24, the shaper 40 is moved relative to the rod 32, as by moving the rod and holding the heater stationary as illustrated in FIG. 1, or by moving the heater relative to a stationary rod. By creation of the molten zone 34 by the heater 20, the melt flows through the shaper 40 at the hole 46 as the shaper 40 traverses across the rod 20. The step 44 and the shaper 40 cooperate to shape the melt and provide a more uniform cross-section and cleaner surface shape than obtained by the prior art. The rate of speed at which the shaper 40 traverses the length of the rod is dependent upon the material of the rod 32 and the temperature of the heater 20.

EXAMPLES

In the following examples of the formation of sodium nitrate ($NaNO_3$) crystal rods, three different types of immersed heaters were used, which were of the types illustrated schematically in FIGS. 2, 3 and 4. The heater shown in FIG. 2 was machined from a Poco graphite. It was 75 mm long, 15 mm wide and 1 mm thick (in the middle region in contact with the melt). This heater had a cylindrical step, 1.5 mm thick and 6 mm in diameter, located at the center of the bottom surface of the heater, to serve as a shaper. A 1 mm diameter hole was drilled through the center of the shaper. A copper fixture was connected to each end of the heater to allow an electric current to pass through the heater and produce Joule heating. A K-type thermocouple 41 was prepared from chromel and alumel wires of 0.13 mm diameter, the bead being tightly fit into a tiny hole in the shaper to allow close control of the heater temperature (within ±0.5° C.) during crystal growth.

The heaters shown in FIGS. 3 and 4 were formed similarly to the one described above. However, they had an aluminum disk (0.5 mm thick and 15 mm in diameter) with a cylindrical step (1.5 mm thick and 6 mm in diameter) at the bottom to serve as a shaper. Aluminum was chosen as the disk/shaper material because it is compatible with the $NaNO_3$ melt, its melting point is high enough for growing $NaNO_3$ crystals and it has a good thermal conductivity. The shapers were provided with holes for melt flow 1 and 2 mm in diameter. The graphite sheet was 75 mm long, 15 mm wide and 1 mm thick. A hole was provided at the center of the graphite sheet to accommodate the shaper. The hole was 6 mm and 8 mm in diameter for the heaters shown in FIGS. 3 and 4, respectively.

Sodium nitrate $NaNO_3$ was selected as a model material for several reasons. First, the melt of $NaNO_3$ is transparent, thus allowing convection in the melt zone to be observed. Second, the $NaNO_3$ melt has a strong tendency to develop thermocapillary convection. In fact, it has been demonstrated that thermocapillary convection, rather than natural convection, dominates in the melt zone of $NaNO_3$. As such, convection in the melt zone of $NaNO_3$ under microgravity can be studied under normal gravity. Third, the melting point of $NaNO_3$ is relatively low (307° C.), the $NaNO_3$ melt is stable below 550° C., and crystal growth can be conducted in open air. $NaNO_3$ crystals have been used in an optical material for polarizing prisms.

Polycrystalline $NaNO_3$ feed rods 6 mm in diameter were prepared by casting. Since some cast rods contained a shrinkage pipe along their centerlines, the cross-sections of the rods were examined and only those rods without a shrinkage pipe were used for crystal growth. The ends of the cast rods were flattened by pushing them against a hot plate set at a temperature above the melting point.

It is worth pointing out that if the density of the feed rod ($\rho_f$) is expected to be significantly different from that of the crystal ($\rho_c$), the cross-sectional area of the shaper, $A_s$, should be set equal to $A_f \rho_f / \rho_c$, where $A_f$ is the cross-sectional area of the feed rod. An obvious example of such a situation is the use of a feed rod prepared by powder sintering.

To initiate the process the heater was set at a temperature above the melting point of $NaNO_3$. A lower cast polycrystalline rod was raised to touch the bottom surface of the shaper. After a thin layer of melt was produced at its top, the rod was raised very slightly to allow the melt to fill up the hole in the shaper. The upper cast polycrystalline rod (i.e., the feed rod) was then lowered to touch the top surface of the heater and a thin layer of melt quickly formed at the bottom of the rod. In this way the melt was continuous through the hole in the shaper, and no air bubbles were trapped in the hole. After its temperature became stabilized, the heater was moved upward at a predetermined constant speed to start crystal growth. The process was very simple and stable and no automatic control (except for heater-temperature control) was necessary. No single crystal seeds were required to grow single crystals of $NaNO_3$.

A transition zone is found in the finished rod between the lower cast rod and the single crystal portion. At the bottom of this zone, i.e., where the crystal growth process is initiated, epitaxial growth dominates. In other words, grains grow expitaxially from the fusion boundary between this zone and the lower cast rod. Above the fusion boundary, i.e., in the bulk transition zone, competitive growth dominates. In other words, growing columnar grains compete with each other for space and the grains with their easy-growth direction pointing nearly vertically up tend to crowd out those less favorably oriented grains. The transition zone is usually rather weak and tends to crack during handling after crystal growth. The length of the transition zone can be affected significantly by the grain size in the lower cast rod. The zone tends to become shorter if a lower cast rod with coarser grains is used. The grain size in the cast rod usually decreases with decreasing temperature of the melt right before casting.

The diameter and surface smoothness of the crystal can be significantly affected by the temperature and travel speed of the heater. A crystal grown with a heater temperature of 315° C. and a growth speed of 1.7 mm/hr was found to have a uniform crystal diameter and a smooth surface. However, the surface was not shiny. A crystal grown at a heater temperature of 324° C. and a speed of 5.2 mm/hr had a reasonably uniform crystal diameter but the surface was rough. Crystals grown at a higher heater temperature of 330° C. and a travel speed of 5.2 mm/hr were found to display a significant improvement in surface quality compared to the crystals grown at lower temperature.

Under certain conditions, the finished crystals contain many gas bubbles. The presence of bubbles can be observed at the melt/shaper interface. When one of these bubbles grows large enough to touch the growth front, it will be caught by the growth front and trapped in the crystal as a gas pore. In situations where many bubbles are present at the bottom surface of the shaper, more than one bubble can grow large enough to touch the growth front at more or less the same time. When this occurs, several gas pores tend to appear at the same height level of the crystal.

During crystal growth gas-forming impurities tend to be rejected by the growing crystal and accumulate ahead of the growth front. When the concentration of such impurities gets high enough, bubbles tend to nucleate heterogeneously at the melt/shaper interface. It was observed that NaNO$_3$ powder tends to absorb moisture from air. It is also likely that water vapor could have been rejected ahead of the growth front and contributed to the formation of gas porosity. It was also observed that a brief vacuum degassing of the NaNO$_3$ melt before casting significantly reduce the gas porosity level in the resultant crystals.

Since the surface of aluminum is covered with a thin layer of aluminum oxide, and since aluminum oxide can absorb moisture slightly, the aluminum shaper disk (when it is used) can be heated at a temperature well above the melting point of NaNO$_3$ (say 450° C.) before crystal growth. This can help drive the moisture (if there is any) out of the surface of the aluminum disk and help reduce gas porosity. Also, when the top surface of the lower cast rod melts during initiation, a small amount of air can be trapped between the shaper and the lower cast rod, resulting in the formation of air bubbles at the bottom of the shaper. If desired, a thermocouple wire of 0.12 mm diameter can be pushed into the melt to wipe out the air bubbles at the bottom surface of the shaper.

It was observed that the NaNO$_3$ crystals had a tendency to crack if the heater was shut off right after growth. One way to avoid cracking is to lower the crystal by about 2 mm, just enough to separate it from the shaper. The heater temperature can then be reduced gradually to room temperature. The other way is to use an after-heater in the form of a heating coil below the immersed heater.

It was observed that the melt had a tendency to creep over the heater surfaces of the heater of the type shown in FIG. 2. This resulted in a decrease in the volume of the melt zone and hence a reduction in the crystal diameter. The extent of melt creeping appeared to increase with decreasing growth speed and increasing heater temperature. The NaNO$_3$ melt which escaped from the melt zone continued to creep outwardly along the length direction of the graphite heater, until the local heater temperature became low enough to cause it to solidify. This usually occurred at a distance about 1.5 cm away from the heater hole. The solidified NaNO$_3$ appeared polycrystalline and it grew as the melt continued to escape from the melt zone. In the heater designs shown in FIGS. 3 and 4 melt creeping was significantly reduced. The design of FIG. 4 appeared more effective in reducing creep due to the provision of a gap between the melt zone and the graphite sheet heater.

Examples of various heater materials or inserts which are compatible with various crystal growth candidates are: platinum, iridium, graphite, carbon or quartz or glass substrates, molybdenum, tungsten, tantalum, rhodium, nickel, iron, aluminum, and stainless steel.

The heater/shaper surfaces in contact with the melt can be coated with a thin film of crucible materials, e.g., BN, SiO$_2$, and Al$_2$O$_3$. BN crucibles are used almost exclusively for growing GaAs crystals, and SiO$_2$ crucibles for Si. Because of recent advances in surface modification technologies, virtually any film can be deposited on any substrate to make it chemically inert toward an otherwise corrosive environment. Examples of such surface modification technologies are chemical vapor deposition, plasma assisted chemical vapor deposition, ion implantation, plasma spraying and plating.

It is understood that the invention is not confined to the particular embodiments herein illustrated and described, but embraces all such modified forms thereof as come within the scope of the following claims.

What is claimed is:

1. Apparatus for growing a monocrystalline body from a polycrystalline feed rod by floating zone refining such that a molten zone is caused to traverse the polycrystalline rod to convert the polycrystalline rod to a monocrystalline body, comprising:

(a) a heater that is positioned to heat a short section of the polycrystalline rod to create the molten zone, the heater formed to include a shaper that contacts the polycrystalline rod in the molten zone and that has a hole to allow flow of molten material in the molten zone between the polycrystalline rod side and the monocrystalline body side of the shaper, the shaper having edge means, including an edge that defines the boundary of the cross-section of the monocrystalline body that is formed as the molten material solidifies, for allowing molten material to flow up to the edge and no further so that the monocrystalline body assumes the outer boundary defined by the edge; and (b) means for moving the heater and the polycrystalline feed rod relative to one another along the rod to form the monocrystalline body.

2. The apparatus of claim 1 further including a thermocouple that is attached to the heater to control the temperature of the molten zone.

3. The apparatus of claim 1 wherein the heater includes a substantially flat sheet portion and the edge of the shaper is defined by a step formed in the sheet which extends downwardly from the sheet.

4. The apparatus of claim 3 wherein the shaper is immersible within the molten zone and the outer periphery of the step is at the edge that defines the boundary of the cross-section of the monocrystalline body.

5. The apparatus of claim 4 wherein the shaper is made of material such that the molten zone material wets the shaper.

6. The apparatus of claim 1 wherein the edge of the shaper is formed to contact the molten material of the molten zone without immersion of the shaper within the cross-section of the molten zone and wherein an inner wall of the shaper meets the edge to define the boundary of the cross-section of the monocrystalline body.

7. The apparatus of claim 6 wherein the shaper is made of material such that the molten zone material does not wet the shaper.

8. The apparatus of claim 6 wherein the shaper has a top end wall and a bottom end wall, the top end facing the polycrystalline feed rod and the bottom end facing the monocrystalline body, the second end having a bevel to minimize wetting of the shaper by the molten material in the molten zone.

9. The apparatus of claim 8 wherein the angle of the bevel is 45°.

10. The apparatus of claim 1 wherein the heater is made of graphite.

11. The apparatus of claim 1 wherein the shaper is formed as a separate element within the heater and the material of the shaper is selected so as not to contaminate the melt zone material.

12. Apparatus for growing a monocrystalline body from a polycrystalline feed rod by floating zone refining such that a molten zone is caused to traverse the polycrystalline rod to convert the polycrystalline rod to a monocrystalline body, comprising:

(a) a heater that is positioned to heat a short section of the polycrystalline rod to create the molten zone, the heater formed to include s shaper that contacts the polycrystalline rod in the molten zone and that has a hole to allow flow of molten material in the molten zone between the polycrystalline rod side and the monocrystalline body side of the shaper, the shaper having an edge that defines the boundary of the cross-section of the monocrystalline body that is formed as the molten material solidifies, wherein the heater includes a substantially flat sheet portion and the edge of the shaper is defined by a step formed in the sheet which extends downwardly from the sheet, the shaper being immersible within the molten zone and the outer periphery of the step being at the edge that defines the boundary of the cross-section of the monocrystalline body, the shaper being formed of a material that is wettable by the molten material in the molten zone such that the molten material flows up to the edge and no further; and (b) means for moving the heater and the polycrystalline feed rod relative to one another along the rod to form the monocrystalline body.

13. The apparatus of claim 12 further including a thermocouple that is attached to the heater to control the temperature of the molten zone.

14. The apparatus of claim 12 wherein the heater is made of graphite.

15. The apparatus of claim 12 wherein the shaper is formed as a separate element within the heater and the material of the shaper is selected so as not to contaminate the melt zone material.

16. Apparatus for growing a monocrystalline body from a polycrystalline feed rod by floating zone refining such that a molten zone is caused to traverse the polycrystalline rod to convert the polycrystalline rod to a monocrystalline body, comprising:

(a) a heater that is positioned to heat a short section of the polycrystalline rod to create the molten zone, the heater formed to include a shaper that contacts the polycrystalline rod in the molten zone and that has a hole to allow flow of molten material in the molten zone between the polycrystalline rod side and the monocrystalline body side of the shaper, the shaper having an edge that defines the boundary of the cross-section of the monocrystalline body that is formed as the molten material solidifies, the hole in the shaper being shaped so that its walls contact the molten material in the molten zone with a bottom surface of the shaper intersecting the wall of the hole to form the edge that defines the boundary of the cross-section of the monocrystalline body such that molten material flows no further than the edge; and (b) means for moving the heater and the polycrystalline feed rod relative to one another along the rod to form the monocrystalline body.

17. The apparatus of claim 16 further including a thermocouple that is attached to the heater to control the temperature of the molten zone near the bottom surface.

18. The apparatus of claim 16 wherein the shaper is made of a material such that the molten material in the molten zone does not wet the shaper.

19. The apparatus of claim 16 wherein the shaper has a top end wall and a bottom end wall which is the bottom surface of the shaper, the top end facing the polycrystalline feed rod and the bottom end facing the monocrystalline body, the bottom end having a bevel to minimize wetting of the shaper by the molten zone.

20. The apparatus of claim 19 wherein the angle of the bevel is 45°.

21. The apparatus of claim 16 wherein the heater is made of graphite.

22. The apparatus of claim 16 wherein the shaper is formed as a separate element within the heater and the material of the shaper is selected so as not to contaminate the melt zone material.

* * * * *